(12) United States Patent
Theis et al.

(10) Patent No.: US 9,807,871 B2
(45) Date of Patent: Oct. 31, 2017

(54) ELECTRONIC ASSEMBLY WITH FIDUCIAL MARKS FOR PRECISION REGISTRATION DURING SUBSEQUENT PROCESSING STEPS

(71) Applicant: 3M INNOVATIVE PROPERTIES COMPANY, St. Paul, MN (US)

(72) Inventors: Daniel J. Theis, Mahtomedi, MN (US); Ann M. Gilman, Woodbury, MN (US); Kim B. Saulsbury, Lake Elmo, MN (US); Matthew S. Stay, Minneapolis, MN (US); Shawn C. Dodds, St. Paul, MN (US); Mikhail L. Pekurovsky, Bloomington, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 60 days.

(21) Appl. No.: 14/912,176

(22) PCT Filed: Aug. 11, 2014

(86) PCT No.: PCT/US2014/050471
§ 371 (c)(1),
(2) Date: Feb. 16, 2016

(87) PCT Pub. No.: WO2015/031033
PCT Pub. Date: Mar. 5, 2015

(65) Prior Publication Data
US 2016/0205772 A1    Jul. 14, 2016

Related U.S. Application Data

(60) Provisional application No. 61/871,244, filed on Aug. 28, 2013.

(51) Int. Cl.
*B32B 3/02* (2006.01)
*H05K 1/02* (2006.01)
(Continued)

(52) U.S. Cl.
CPC ......... *H05K 1/0266* (2013.01); *H05K 1/0269* (2013.01); *H05K 1/0296* (2013.01);
(Continued)

(58) Field of Classification Search
CPC .. H05K 1/0269; H05K 1/0266; H05K 1/0393; H05K 1/0296; H05K 3/048
See application file for complete search history.

(56) References Cited

U.S. PATENT DOCUMENTS

| 4,165,688 A | 8/1979 | Leanna |
|---|---|---|
| 4,366,754 A | 1/1983 | Sarda |

(Continued)

FOREIGN PATENT DOCUMENTS

| CN | 103034366 A | 4/2013 |
|---|---|---|
| JP | 2012-079738 A | 4/2012 |

(Continued)

OTHER PUBLICATIONS

Sun, "Uniform Silver Nanowires Synthesis by Reducing $AgNO_3$ with Ethylene Glycol in the Presence of Seeds and Poly(Vinyl Pyrrolidone)"; Chem. Mater. 2002, vol. 14, No. 11; 2002; pp. 4736-4745.

(Continued)

*Primary Examiner* — Elizabeth Mulvaney
(74) *Attorney, Agent, or Firm* — James A. Baker

(57) ABSTRACT

An electronic assembly includes a substrate having in a first zone a low contrast first conductive pattern; a high contrast fiducial mark in a second zone of the substrate different from the first zone, wherein the fiducial mark and the first conductive pattern are in registration; and a second conductive pattern aligned with the first conductive pattern.

20 Claims, 7 Drawing Sheets

(51) Int. Cl.
*H05K 3/04* (2006.01)
*H05K 1/09* (2006.01)
*H05K 1/03* (2006.01)

(52) U.S. Cl.
CPC ............. *H05K 1/097* (2013.01); *H05K 3/048* (2013.01); *H05K 1/0393* (2013.01); *H05K 2201/0145* (2013.01); *H05K 2201/0154* (2013.01); *H05K 2201/026* (2013.01); *H05K 2201/10128* (2013.01); *H05K 2203/1545* (2013.01)

(56) References Cited

U.S. PATENT DOCUMENTS

| | | | |
|---|---|---|---|
| 4,559,871 A | 12/1985 | Kutzner |
| 4,667,595 A | 5/1987 | Geretzki |
| 4,796,528 A | 1/1989 | Sarazen |
| 4,895,631 A | 1/1990 | Wirz |
| 5,012,736 A | 5/1991 | Van Kanegan |
| 5,150,651 A | 9/1992 | Flores |
| 5,243,907 A | 9/1993 | Weishew |
| 5,440,446 A | 8/1995 | Shaw |
| 5,910,830 A | 6/1999 | Nam |
| 6,029,574 A | 2/2000 | Richards |
| 6,177,214 B1 | 1/2001 | Yokoyama et al. |
| 6,975,067 B2 | 12/2005 | McCormick |
| 7,018,713 B2 | 3/2006 | Padiyath |
| 8,094,247 B2 | 1/2012 | Allemand et al. |
| 2003/0211406 A1 | 11/2003 | Keusseyan |
| 2009/0130570 A1 | 5/2009 | Zhang |
| 2009/0283304 A1 | 11/2009 | Winoto |
| 2010/0007035 A1 | 1/2010 | Shimada |
| 2010/0038650 A1 | 2/2010 | Sohn |
| 2010/0097462 A1 | 4/2010 | Carlson et al. |
| 2010/0188668 A1 | 7/2010 | Carlson |
| 2010/0196607 A1 | 8/2010 | Carlson |
| 2011/0247511 A1 | 10/2011 | Carlson |
| 2011/0257779 A1 | 10/2011 | Theis |
| 2012/0068376 A1 | 3/2012 | Sano |
| 2012/0319980 A1 | 12/2012 | Nagaoka et al. |
| 2013/0056440 A1 | 3/2013 | Iwase et al. |

FOREIGN PATENT DOCUMENTS

| | | |
|---|---|---|
| KR | 2009-0022903 | 3/2009 |
| WO | WO 2007-022226 | 2/2007 |
| WO | WO 2014-088950 | 6/2014 |
| WO | WO 2014-099507 | 6/2014 |

OTHER PUBLICATIONS

Sun, "Polyol Synthesis of Uniform Silver Nanowires: A Plausible Growth Mechanism and the Supporting Evidence"; Nano Letters; vol. 3, No. 7, 2003; pp. 955-960.

International Search Report for PCT International Application No. PCT/US2014/050471, dated Nov. 7, 2014, 3 pages.

ELECTRONIC ASSEMBLY WITH FIDUCIAL MARKS FOR PRECISION REGISTRATION DURING SUBSEQUENT PROCESSING STEPS

CROSS-REFERENCE TO RELATED APPLICATIONS

This application is a national stage filing under 35 U.S.C. 371 of PCT/US2014/050417, filed Aug. 11, 2014, which claims priority to U.S. Application No. 61/871,244, filed Aug. 28, 2013, the disclosure of which is incorporated by reference in its/their entirety herein.

BACKGROUND

The fabrication of articles such as flexible electronic or optical components can involve the application of layers of material deposited or formed on an elongated substrate or web. In particular, patterns of material may be deposited in layers on an elongated substrate, such as a web, through multiple deposition steps. Some articles require precise registration of features that are applied on one or both sides of the substrate.

To achieve accurate registration between the layers, lateral (cross web) positioning and longitudinal (down web) positioning must be maintained as the substrate moves through multiple manufacturing steps. Maintaining registration between layers formed on the substrate becomes more complex when the substrate is flexible or stretchable. Some articles are made in multiple steps during which materials or processes are sequentially applied to the substrate, requiring precise position registration for each of the process steps.

SUMMARY

Listing of Embodiments

A. A method, including: forming a resist layer overlying a patterned conductive nanowire layer in a first zone on a substrate to form a low contrast first conductive pattern; forming, substantially simultaneously with the first conductive pattern, a high contrast fiducial mark in a second zone of the substrate different from the first zone, wherein the fiducial mark is in registration with the first conductive pattern; and, forming, using the fiducial mark as a guide, a second pattern aligned with the first conductive pattern.

B. The method of embodiment A, wherein the first conductive pattern has an optical transmission of greater than about 80%.

C. The method of any of embodiments A-B, wherein the fiducial mark has an optical transmission of about 0% to about 50%.

D. The method of any of embodiments A-C, wherein the error in registration between the fiducial mark and the first conductive pattern is less than about 20 microns.

E. The method of any of embodiments A-D, wherein the first conductive pattern includes features having a dimension less than 200 microns in size.

F. The method of any of embodiments A-E, wherein the second pattern is conductive.

G. The method of embodiment F, wherein the second pattern is aligned with the first conductive pattern and forms an electronic assembly.

H. The method of any of embodiments A-G, wherein the patterned conductive nanowire layer in the first zone on the substrate is produced by:
  coating a substrate with a conductive layer comprising nanowires;
  applying a pattern on the conductive layer with a resist matrix material to generate on the substrate one or more first regions of exposed conductive layer and one or more second regions of resist matrix material;
  hardening or curing the resist matrix material;
  over coating the pattern with a strippable polymer layer;
  hardening or curing the strippable polymer layer;
  peeling the strippable polymer layer from the substrate; and
  removing the exposed conductive layer from the substrate in the one or more first regions of the substrate to form a patterned conductive layer on the substrate, wherein the patterned conductive layer comprises nanowires overlain by the resist matrix material.

I. The method of embodiment H, wherein the pattern on the conductive layer is applied by a process selected from at least one of photolithography, flexographic printing, gravure printing, ink jet printing, screen printing, spray coating, needle coating, photolithographic patterning, and offset printing.

J. The method of any of embodiments A-I, wherein the fiducial mark is formed by a process selected from at least one of photolithography, flexographic printing, gravure printing, ink jet printing, screen printing, spray coating, needle coating, photolithographic patterning, and offset printing.

K. An electronic assembly, including: a substrate having in a first zone a low contrast first conductive pattern; a high contrast fiducial mark in a second zone of the substrate different from the first zone; wherein the fiducial mark and the first conductive pattern are in registration; and a second conductive pattern aligned with the first conductive pattern.

L. The electronic assembly of embodiment K, wherein the fiducial mark and the first conductive pattern are in registration with a dimensional accuracy of less than about 100 microns.

M. The electronic assembly of any of embodiments K-L, wherein the fiducial mark and the first conductive pattern are in registration with a dimensional accuracy of less than about 20 microns.

N. The electronic assembly of any of embodiments K-M, wherein the difference in optical transmission in the visible light region on the substrate between the fiducial mark and the second conductive pattern is greater than about 50%.

O. The electronic assembly of any of embodiments K-N, wherein the first conductive pattern has an optical transmission in the visible light region of about 80% to about 99.9%.

P. The electronic assembly of any of embodiments K-O, wherein the fiducial mark has an optical transmission in the visible region of less than about 50%.

Q. The electronic assembly of any of embodiments K-P, wherein the second conductive pattern is a circuit interconnect.

R. The electronic assembly of any of embodiments K-Q, wherein the circuit interconnect is in-plane with respect to the first conductive pattern.

S. The electronic assembly of any of embodiments K-R, wherein the circuit interconnect is out of plane with respect to the first conductive pattern.

T. The electronic assembly of any of embodiments K-S, wherein the first conductive pattern is derived from a first ink, and the fiducial mark is derived from a second ink different from the first ink, and wherein the first ink is soluble in a selected solvent, and the second ink is insoluble in the selected solvent.

U. A display incorporating the electronic assembly of any of embodiments K-T.

V. An electronic assembly, including: a substrate including in a first zone a first conductive pattern, wherein the first conductive pattern includes conductive nanowires overlain by a layer of a resist matrix material, and wherein the conductive pattern has an optical transmission in the visible region of greater than about 80%; a fiducial mark in a second zone of the substrate different from the first zone, wherein the fiducial mark has an optical transmission in the visible region of less than about 50%, and wherein the fiducial mark and the second conductive pattern are in registration with a dimensional accuracy of less than about 100 microns; and a second conductive pattern aligned with the first conductive pattern.

W. The electronic assembly of embodiment V, wherein the resist matrix material has a thickness of about 10 nanometers to about 3000 nanometers.

X. The electronic assembly of any of embodiments V-W, wherein the resist matrix material has a light transmission of at least 80%.

Y. The electronic assembly of any of embodiments V-X, wherein the second conductive pattern is a circuit interconnect.

Z. The electronic assembly of any of embodiments V-Y, wherein the circuit interconnect is derived from an ink comprising conductive metal nanoparticles.

AA. A display incorporating the electronic assembly of any of embodiments V-Z.

BB. The display of embodiment AA, wherein the display is a touch screen display, optionally wherein the touch screen display is a component of an electronic device selected from a cellular telephone, a tablet computer, a notebook computer, a laptop computer, a computer display, or a television.

In this application, "contrast" means the degree of dissimilarity of a measured quantity such as luminance of two areas, expressed as a number computed by a specified formula. This definition comes from ASTM Standard E284, "Standard Terminology of Appearance." In the broadest sense a "low contrast ink" is any ink that is insufficiently optically distinguishable from the substrate to allow a secondary operation on the substrate to be directly registered with predetermined pattern. A more formal definition is presented in connection with the optical test discussed in Example 3 below.

In this application, "predetermined pattern" means a pattern that can include lines, repeating lines, traces, symbols, letters, figures, graphics, numbers, or combinations thereof by way of example; that is determined or selected in advance to be placed onto the substrate by suitable replicating methods such as printing. The predetermined pattern can include features having a dimension of less than 1000, 500, 100, 20, 10, or 5 microns in size.

In this application, "fiducial marks" means a pattern of symbols, lines, points, or other shapes placed onto the substrate for use by an imaging system as a point of reference for obtaining information on web displacement, web speed, or web position.

In this application, the terms "about" or "approximately" with reference to a numerical value, property, or characteristic, means+/−five percent of the numerical value, property, or characteristic, but also expressly includes any narrow range within the +/−five percent of the numerical value or property or characteristic as well as the exact numerical value. For example, a temperature of "about" 100° C. refers to a temperature from 95° C. to 105° C., inclusive, but also expressly includes any narrower range of temperature or even a single temperature within that range, including, for example, a temperature of exactly 100° C.

In this application, the term "substantially" with reference to a property or characteristic means that the property or characteristic is exhibited to within 98% of that property or characteristic, but also expressly includes any narrow range within the two percent of the property or characteristic, as well as the exact value of the property or characteristic. For example, a substrate that is "substantially" transparent refers to a substrate that transmits 98-100%, inclusive, of the incident light.

Those skilled in the art will more fully understand the nature of the invention upon consideration of the remainder of the disclosure, including the Detailed Description, the Examples, and the appended claims.

BRIEF DESCRIPTION OF THE DRAWINGS

It is to be understood by one of ordinary skill in the art that the present discussion is a description of exemplary embodiments only, and is not intended as limiting the broader aspects of the present disclosure, which broader aspects are embodied in the exemplary construction.

Figure 1:
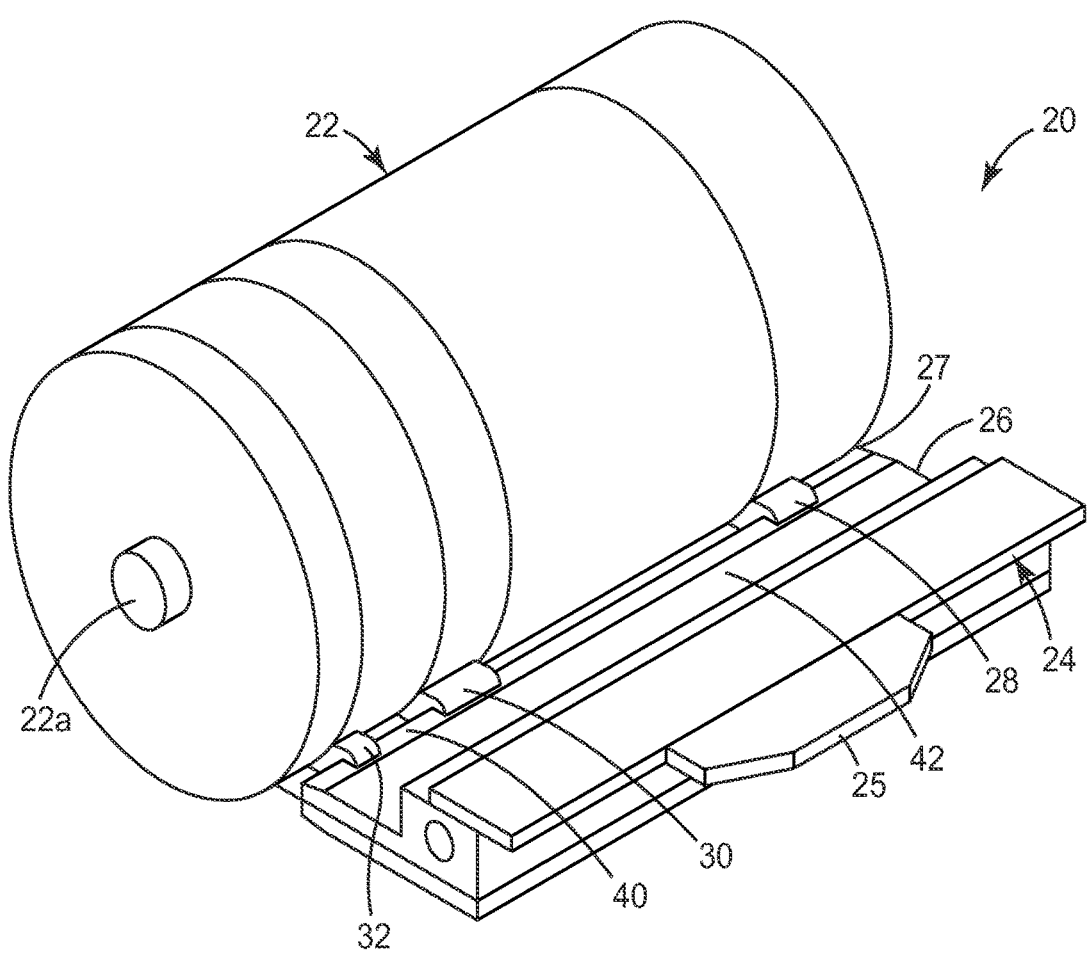
FIG. 1 is a perspective view of a printing apparatus including a printing roll adjacent to a doctor blade assembly divided into zones along its cross web width.

Repeated use of reference characters in the specification and drawings is intended to represent the same or analogous features or elements of the disclosure.

DETAILED DESCRIPTION

Referring now to FIG. 1, a printing apparatus 20 suitable for carrying out the present disclosure is illustrated. The printing apparatus 20 includes a printing roll 22 and a doctor blade assembly 24 adjacent to the printing roll 22. In some alternate embodiments roll 22 is a transfer roll such as an anilox roll that inks a separate printing roll indirectly. Printing roll 22 may be either a live shaft roll having a shaft 22a or a dead shaft roll. Printing roll 22 is conveniently an anilox roll, but the invention is workable with, e.g. equipment for flexo printing, gravure printing, flatbed or rotary screen printing, ink jet printing, and dual offset printing. Doctor blade assembly 24 conveniently includes support 25 and blade support 26. The blade support 26 retains the actual doctor blade 27. The illustrated blade support 26 includes barriers 28, 30, and 32 that divide the cross web width of the blade support 26 into a first zone 42 and a second zone 40. The barriers 28, 30, and 32 are conveniently formed from a soft, resilient material that can seal against the side of printing roll 22 without scratching it.

Figure 2:
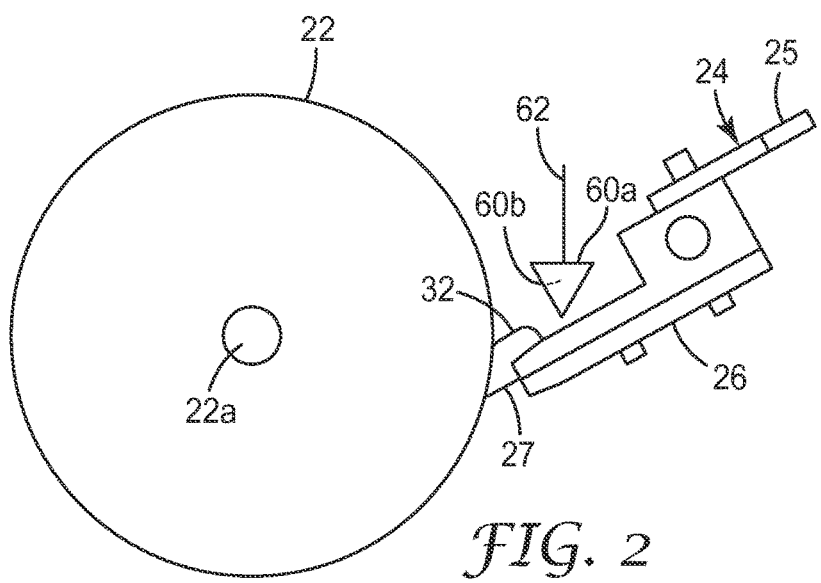
FIG. 2 is a side schematic view of the printing apparatus of FIG. 1.

Referring now to FIG. 2, a side view of the printing apparatus 20 of FIG. 1 is illustrated. In this side view, it can be better appreciated how the doctor blade 27 is supported by blade support 26. Also seen in this view is a first ink dispenser 60a omitted from FIG. 1 for visual clarity. First ink dispenser 60a is connected to a first ink supply 62 for dispensing a first ink into the first zone (42 in FIG. 1) of the blade support 26. In this view, a similar second ink dispenser 60b is disposed behind the first ink dispenser 60a and hidden from view for dispensing a second ink into the second zone (40 in FIG. 1). Depending on user preferences and/or the type of printing being contemplated, the form of the ink dispensers can take numerous forms such as spouts, sprayers, fed brushes, fed rollers, open pans, enclosed pans, open applicators (forward or reverse bladed), or the like.

Figure 3:
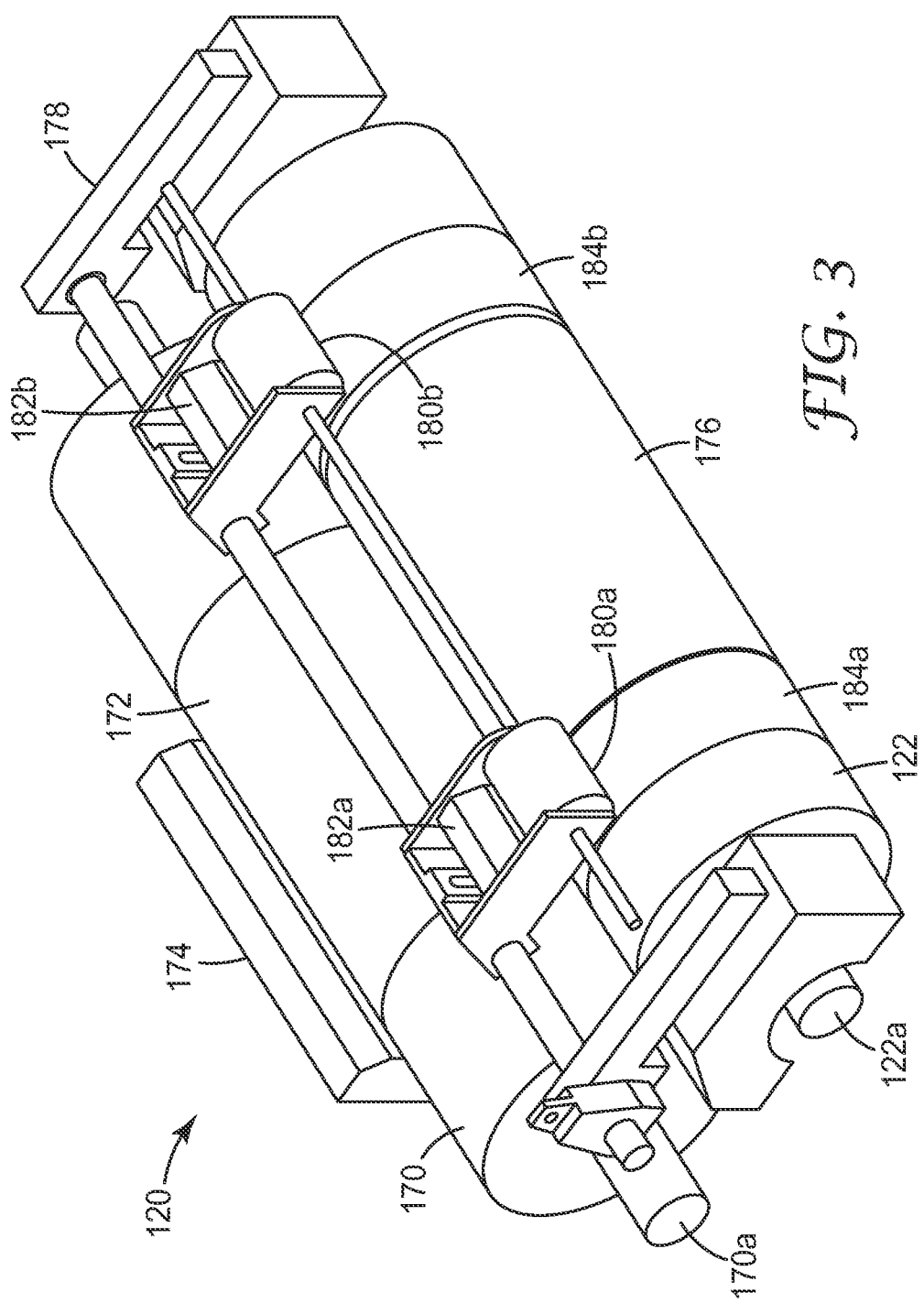
FIG. 3 is a perspective view of an alternate printing apparatus according to one embodiment of the present disclosure.

Referring now to FIG. 3, an alternative printing apparatus 120 suitable for carrying out the present invention is illustrated. The printing apparatus 120 includes a printing roll 122. Printing roll 122 may be either a live shaft roll having a shaft 122a or a dead shaft roll. Analogous to printing apparatus 20 above, printing roll 122 is conveniently an anilox roll, but the invention is workable with, e.g. equipment for flexographic printing, gravure printing, screen printing, ink jet printing, and dual offset printing. In the illustrated embodiment, the printing roll 122 is adjacent to a main inking roll 170 which is rotatable about shaft 170a. The inking roll 170 is inked with a first ink in a first zone 172 by a main inker 174. The first ink in the first zone 172 is transferred to printing roll 122 in a first receiving zone 176.

A support 178 carries at least one (in this illustrated embodiment, two) subsidiary inking rolls 180a and 180b, each inked with a second ink by secondary inkers 182a and 182b, respectively. The second ink is transferred to printing roll 122 in two second receiving zones 184a and 184b. The substrate, in many convenient embodiments a web of indefinite length material, can then be brought into contact with the printing roll 122 in a conventional manner.

Figure 4:
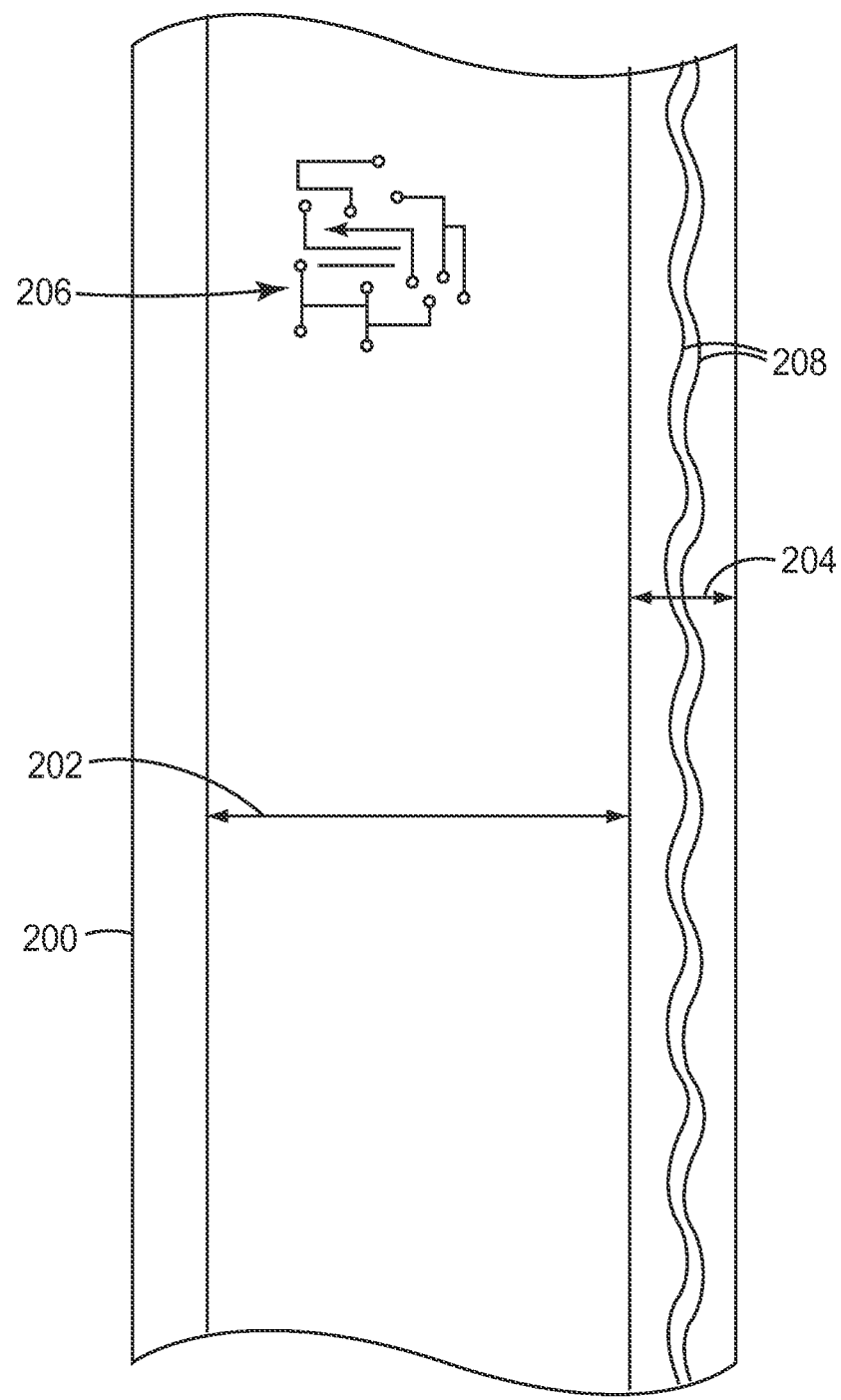
FIG. 4 is a plan view of a web of indefinite length steering that has had a first and second ink printed in first and second zones by an apparatus according the present disclosure.

Referring now to FIG. 4, illustrated is a plan view of a web 200 of indefinite length that has had a first and second ink printed in first zone 202 and second zone 204 respectively by one of the apparatuses as discussed above. Within first zone 202, a predetermined pattern 206 has been printed (for example, a security marking in a low-contrast ink or the pattern of an electronic circuit in a soluble ink). A pair of continuous fiducial marks 208 has been printed in the second zone 204. In various embodiments, the fiducial marks and the predetermined pattern are in registration with a dimensional accuracy of less than 20, 10, or even 5 microns.

In embodiments not shown in FIG. 4, the fiducial marks 208 may be discrete, non-continuous marks, which may be used alone or in combination with continuous fiducial marks. In a non-limiting example, discrete fiducial marks may provide down-web position information, while continuous fiducial marks may provide down-web pattern position information.

In one embodiment, which is provided as an example and is not intended to be limiting, the predetermined pattern 206 in the first zone 202 on the web substrate 200 is formed by coating a substrate with a conductive layer including nanowires as described in detail in 3M File No. 69879US002.

Figure 5:
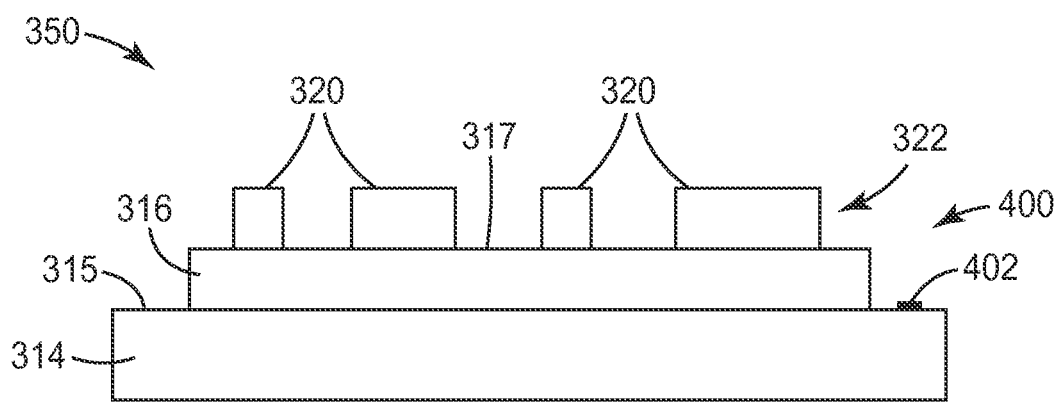
FIG. 5 is a schematic, cross-sectional view of a conductive nanowire layer in a first zone of a substrate, wherein the conductive nanowire layer is overlain by a patterned resist matrix material.

Referring to FIG. 5, a conductive nanowire layer 316 is substantially continuous over at least a portion of a first major surface 315 of a first zone 350 of a substrate 314, and desirably over at least 50%, 60%, 70%, 80%, or 90% of the area of the first major surface 315. The conductive nanowire layer 316 may be coated continuously along the first substrate zone 314, or may be applied in discrete blocks or rectangles, leaving uncoated substrate areas between them, with the blocks or rectangles having a size similar to the overall size of the intended touch screen being produced. By "substantially continuous" it is meant the nanowires are applied at a sufficient density to render the surface of the substrate conductive, it being recognized that a nanowire layer will include individual wires with openings or spaces between them as shown in, for example, FIG. 15B in WO 2007/022226.

The conductive nanowire layer 316 includes conductive nanowires. In this application, the term nanowire refers to conductive metal or non-metallic filaments, fibers, rods, strings, strands, whiskers, or ribbons having high aspect ratios (e.g., higher than 10). Examples of non-metallic conductive nanowires include, but are not limited to, carbon nanotubes (CNTs), metal oxide nanowires (e.g., vanadium pentoxide), metalloid nanowires (e.g., silicon), conductive polymer fibers and the like.

As used herein, "metal nanowire" refers to a metallic wire including elemental metal, metal alloys or metal compounds (including metal oxides). At least one cross sectional dimension of the metal nanowire is less than 500 nm, or less than 200 nm, and more preferably less than 100 nm. As noted, the metal nanowire has an aspect ratio (length:width) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and polyvinyl pyrrolidone). Large-scale production of silver nanowires of uniform size can be prepared according to the methods described in, e.g., Sun et al., Chem. Mater. (2002), 14, 4736-4745, and Sun et al., Nanoletters (2003) 3(7), 955-960. More methods of making nanowires, such as using biological templates, are disclosed in WO 2007/022226.

In certain embodiments, the nanowires are dispersed in a liquid and a nanowire layer on the substrate is formed by coating the liquid containing the nanowires onto the substrate and then allowing the liquid to evaporate (dry) or cure. The nanowires are typically dispersed in a liquid to facilitate more uniform deposition onto the substrate by using a coater or sprayer.

Any non-corrosive liquid in which the nanowires can form a stable dispersion (also called "nanowire dispersion") can be used. Preferably, the nanowires are dispersed in water, an alcohol, a ketone, ethers, hydrocarbons or an aromatic solvent (benzene, toluene, xylene, etc.). More preferably, the liquid is volatile, having a boiling point of no more than 200 degrees C. (° C.), no more than 150° C., or no more than 100° C.

In addition, the nanowire dispersion may contain additives or binders to control viscosity, corrosion, adhesion, and nanowire dispersion. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene gylcol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl FSN, Zonyl FSO, Zonyl FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

If it is desired to change the concentration of the dispersion from that disclosed above, the percent of the solvent can be increased or decreased. In preferred embodiments the relative ratios of the other ingredients, however, can remain the same. In particular, the ratio of the surfactant to the viscosity modifier is preferably in the range of about 80:1 to about 0.01:1; the ratio of the viscosity modifier to the nanowires is preferably in the range of about 5:1 to about 0.000625:1; and the ratio of the nanowires to the surfactant is preferably in the range of about 560:1 to about 5:1. The ratios of components of the dispersion may be modified depending on the substrate and the method of application used. The preferred viscosity range for the nanowire dispersion is between about 1 and 1000 cP (0.001 and 1 Pa-s).

The substrate 314 in FIG. 5 can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Another suitable substrate is a flexible glass material available under the trade designation Willow Flexible Glass from Corning, Inc., Corning, N.Y. Additional examples of suitable substrates can be found in, e.g., U.S. Pat. No. 6,975,067.

Optionally, the surface of the substrate can be pre-treated to prepare the surface to better receive the subsequent deposition of the nanowires. Surface pre-treatments serve multiple functions. For example, they enable the deposition of a uniform nanowire dispersion layer. In addition, they can immobilize the nanowires on the substrate for subsequent processing steps. Moreover, the pre-treatment can be carried out in conjunction with a patterning step to create patterned deposition of the nanowires. As described in WO 2007/022226, pre-treatments can include solvent or chemical washing, heating, deposition of an optional patterned intermediate layer to present an appropriate chemical or ionic state to the nanowire dispersion, as well as further surface treatments such as plasma treatment, ultraviolet radiation (UV)-ozone treatment, or corona discharge.

The nanowire dispersion that forms the nanowire layer 316 can be applied to the substrate at a given thickness selected to achieve desired optical and electrical properties. This application is performed using known coating methods, such as slot coating, roll coating, Mayer rod coating, dip coating, curtain coating, slide coating, knife coating, gravure coating, notch bar coating or spraying, yielding a conductive nanowire layer on the substrate. The nanowire layer 316 may also be deposited non-continuously using a printing technique including, but not limited to, gravure, flexographic, screen, letterpress, ink jet printing, and the like. This coating step can be performed either as a roll-to-roll process or in a piece-part fashion.

Following the deposition, the liquid of the dispersion is typically removed by evaporation. The evaporation can be accelerated by heating (e.g., using a dryer). The resulting conductive nanowire layer may require post-treatment to render it more electrically conductive. This post-treatment can be a process step involving exposure to heat, plasma, corona discharge, UV-ozone, or pressure as further described in WO 2007/02226. Optionally coating the substrate with a nanowire layer can be followed by hardening or curing the nanowire layer.

Optionally, the conductive nanowire layer 316 can be coated onto the substrate 314 by a process wherein the layer is delivered to the substrate surface 315 using means other than liquid dispersion coating. For example, a nanowire layer can be dry-transferred to a substrate surface from a donor substrate. As a further example, nanowires can be delivered to a substrate surface from a gas phase suspension.

In one specific embodiment, a layer of aqueous dispersion of nanowires (for example, dispersions available from Cambrios under the trade designation ClearOhm Ink) was applied to a PET substrate in the range 10.0 to 25 microns thick using a slot die coating technique. The coating formulation (e.g. % total solids by wt. and % silver nanowire solids by wt.) can be selected, along with the coating and drying process conditions, to create a nanowire layer with designed electrical and optical properties, e.g. a desired sheet resistance (Ohm/Sq) and optical properties such as transmission (%) and haze (%).

The conductive nanowire layer 316 that results from coating nanowires on a substrate (e.g., from a nanowire dispersion) includes nanowires and optionally binder or additives. The nanowire layer preferably includes an interconnected network of nanowires. The nanowires that make up the nanowire layer are preferably electrically connected to each other, leading approximately or effectively to a sheet conductor. The nanowire layer includes open space between the individual nanowires that make up the layer, leading to at least partial transparency (i.e., light transmission). Nanowire layers having an interconnected network of nanowires with open space between the individual nanowires may be described as transparent conductor layers.

Typically, the optical quality of the nanowire layer 316 can be quantitatively described by measureable properties including light transmission and haze. "Light transmission" refers to the percentage of an incident light transmitted through a medium. In various embodiments, the light transmission of the conductive nanowire layer is at least 80% and can be as high as 99.9%. In various embodiments, the light transmission of the conductive layer such as the nanowire layer is at least 80% and can be as high as 99.9% (e.g., 90% to 99.9%, 95% to 99.5%, 97.5% to 99%). For a transparent conductor in which the nanowire layer is deposited or laminated (e.g., coated) on a substrate (e.g., a transparent substrate), the light transmission of the overall structure may be slightly diminished as compared with the light transmission of the constituent nanowire layer. Other layers that may be present in combination with the conductive nanowire layer and the substrate, such as an adhesive layer, anti-reflective layer, anti-glare layer, may improve or diminish the overall light transmission of the transparent conductor. In various embodiments, the light transmission of the transparent conductor comprising a conductive nanowire layer deposited or laminated on a substrate and one or more others layers can be at least 50%, at least 60%, at least 70%, at least 80%, at least 90%, or at least 91%, and may be as high as at least 91% to 99%.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In accordance with ASTM Standard No. D1003-11, haze can be defined as the proportion of transmitted light that is deflected by an angle greater than 2.5 degrees. In various embodiments, the haze of the conductive nanowire layer is no more than 10%, no more than 8%, no more than 5%, no more than 2%, no more than 1%, no more than 0.5%, or no more than 0.1% (e.g., 0.1% to 5% or 0.5 to 2%). For a transparent conductor in which the conductive nanowire layer is deposited or laminated (e.g., coated) on a substrate (e.g., a transparent substrate), the haze of the overall structure may be slightly increased as compared with the haze of the constituent nanowire layer. Other layers that may be present in combination with the conductive nanowire layer and the substrate, such as an adhesive layer, anti-reflective layer, anti-glare layer, may improve or diminish the overall haze of the transparent conductor comprising a nanowire layer. In various embodiments, the haze of the transparent conductor comprising a conductive nanowire layer deposited or laminated on a substrate can be no more than 10%, no more than 8%, no more than 5%, no more than 2%, no more than 1%, no more than 0.5%, or no more than 0.1% (e.g., 0.1% to 5% or 0.5 to 2%). "Clarity" is the proportion of transmitted light that is deflected by an angle less than 2.5 degrees.

The sheet resistance, transmission, and haze of the conductive nanowire layer 316 can be tailored by varying certain attributes of the layer and its constituent materials such as the nanowires. Regarding the nanowires, they can be varied, for example, in composition (e.g., Ag, Cu, Cu—Ni alloy, Au, Pd), length (e.g., 1 micrometer, 10 micrometers, 100 micrometers, or greater than 100 micrometers), cross-sectional dimension (e.g., diameter of 10 nanometers, 20 nanometers, 30 nanometers, 40 nanometers, 50 nanometers, 75 nanometers, or greater than 75 nanometers). Regarding the conductive layer comprising the nanowires, it can be varied, for example, in its other components (e.g., cellulosic binders, processing aids such as surfactants, or conductance enhancers such as conducting polymers) or its area density of nanowires (e.g., greater than 10 per square millimeter, greater than 100 per square millimeter, greater than 1000 per square millimeter, or even greater than 10000 per square millimeter). Accordingly, the sheet resistance of the conductive layer or nanowire layer may be less than 1,000,000 Ohm/Sq, less than 1,000 Ohm/Sq, less than 100 Ohm/Sq, or even less than 10 Ohm/Sq (e.g., 1 Ohm/Sq to 1,000 Ohm/Sq, 10 Ohm/Sq to 500 Ohm/Sq, 20 Ohm/Sq to 200 Ohm/Sq, or 25 to 150 Ohm/Sq). The transmission of the conductive layer or nanowire layer may be at least 80% and can be as high as 99.9% (e.g., 90% to 99.9%, 95% to 99.5%, or 97.5% to 99%). The haze of the conductive layer or nanowire layer 316 may be no more than 10%, no more than 8%, no more than 5%, no more than 2%, no more than 1%, no more than 0.5%, or no more than 0.1% (e.g., 0.1% to 5% or 0.5 to 2%).

Referring again to FIG. 5, a pattern of a resist matrix material is applied on the conductive nanowire layer 316 to generate on the substrate 314 one or more first regions 317 of exposed conductive nanowire layer and one or more second regions 322 of the resist matrix material (for example, a circuit pattern for a touch screen). The resist matrix material 320 can be applied to or patterned on the conductive nanowire layer 316, for example, by printing, and upon being so applied renders the conductive nanowire layer more adherent or protected on the substrate.

In certain embodiments, the matrix material 320 includes a polymer and desirably an optically clear polymer. Examples of suitable polymeric resist matrix materials include, but are not limited to: polyacrylics such as polymethacrylates, polyacrylates and polyacrylonitriles, polyvinyl alcohols, polyesters (e.g., polyethylene terephthalate (PET), polyester naphthalate (PEN), and polycarbonates (PC)), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinylidene fluoride (PVDF), polytetrafluoroethylene (PTFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by DuPont Corp.).

In other embodiments, the resist matrix material 320 includes a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In some embodiments, the prepolymer is photo-curable, i.e., the prepolymer polymerizes and/or cross-links upon exposure to irradiation. Resist matrix materials based on photo-curable prepolymers can be patterned by exposure to irradiation in selective regions, or by selective placement of the prepolymer on the substrate followed by uniform exposure to irradiation. In other embodiments, the prepolymer is thermal-curable, which can be patterned in a similar manner, though exposure to a heat source is used in place of exposure to irradiation.

Typically, the resist matrix material 320 is applied as a liquid. The resist matrix material may optionally include a solvent (e.g., during application). Optionally, the solvent may be removed during the application process, for example before over-coating with the strippable polymer layer. Any non-corrosive solvent that can effectively solvate or disperse the matrix material can be used. Examples of suitable solvents include water, an alcohol, a ketone, an ether, tetrahydrofuran, hydrocarbons (e.g. cyclohexane) or an aromatic solvent (benzene, toluene, xylene, etc.). The solvent can be volatile, having a boiling point of no more than 200° C., no more than 150° C., or no more than 100° C.

In some embodiments, the resist matrix material 320 may include a cross-linker, a polymerization initiator, stabilizers (including, for example, antioxidants, and UV stabilizers for longer product lifetime and polymerization inhibitors for greater shelf-life), surfactants and the like. In some embodiments, the matrix material 320 may further include a corrosion inhibitor. In some embodiments, the resist matrix material itself is conductive. For example, the matrix can include a conductive polymer. Conductive polymers are known in the art, including without limitation: polyanilines, polythiophenes, and polydiacetylenes.

In some embodiments, the resist matrix material has a thickness of about 10 nanometers to about 2 microns, about 300 nanometers to about 2 microns, about 20 nanometers to about 200 nanometers, about 40 nanometers to 200 nanometers, or about 50 nanometers to 200 nanometers.

In some embodiments, the resist matrix material has a refractive index of between about 1.30 and 2.50, between about 1.40 and 1.70, or between about 1.35 and 1.80.

The resist matrix material 320 adds integrity to the conductive nanowire layer 316 and can promote improved adhesion of the conductive nanowire layer 316 to the surface 315 of the substrate 314.

Typically, the resist matrix material 320 is an optically clear material. A material is considered optically clear if the light transmission of the material is at least 80% in the visible region (400 nm-700 nm). Unless specified otherwise, all the layers (including the substrate) described herein are preferably optically clear. The optical clarity of the resist matrix material is typically determined by a multitude of factors, including without limitation: the refractive index (RI), thickness, smoothness, consistency of the RI throughout the thickness, surface (including interface) reflection, and scattering caused by surface roughness and/or embedded particles.

As discussed above, the resist matrix material 320 may be cured and/or hardened into a protective layer in selected regions forming a pattern over the conductive nanowire layer 316. "Cure or curing" refers to a process where monomers or partial polymers (e.g. oligomers comprising fewer than 150 monomer units) polymerize so as to form a solid polymeric matrix, or where polymers cross-link. Suitable polymerization or cross-linking conditions are well known in the art and include by way of example, heating the monomer, irradiating the monomer with visible or ultraviolet (UV) light, electron beams, and the like. Alternatively, "harden(s) or hardening" may be caused by solvent removal during drying of a resist matrix material, for example without polymerization or cross-linking The resist matrix material 320 is patterned by a suitable patterning process. Suitable patterning processes include subtractive methods such as photolithography (wherein the resist matrix material is a photoresist). Suitable patterning processes also include direct printing. As discussed above, hardening or curing of the printed resist occurs prior to the next process step. Suitable printers or patterning methods are known and include the illustrated flexographic printer, gravure printing, ink jet printing, screen printing, spray coating, needle coating, photolithographic patterning, and offset printing.

Suitable patterns involve features whose smallest dimension, either width or length, are greater than zero micron such as greater than 0.001 micron and less than 1 micron, less than 10 microns, less than 100 microns, less than 1 mm, or less than 10 mm. Any upper bound on the feature size is limited only by the size of the substrate on which printing occurs. In the case of roll-to-roll printing, this is effectively indefinite in the machine direction of the web. These features can take on any shape that can be patterned, such as stars, squares, rectangles, or circles. Often the features will be parallel lines or a grid sensitive to touch for use as a component in a touch screen.

Referring again to FIG. 5, as the resist matrix material 320 is patterned in the first zone 350 of the substrate 314, at least one fiducial mark 402 is substantially simultaneously printed in a second zone 400 of the substrate 314, which is different from the first zone. The ink utilized to form the fiducial mark 402 in the second zone 400 should preferably have sufficient contrast with respect to the ink used to form the nanowire layer 316 and the ink used to form the resist matrix material 320 in the first zone 350 to provide a consistent optical contrast for sensing by a suitable imaging system. For example, in some embodiments the ink used to form the nanowire layer 316 and the resist matrix material 320 in the first zone 350 have low contrast with respect to the substrate material 314, and may be very light or invisible when observed in visible light with the naked eye. The ink used to form the fiducial mark 402 in the second zone 400 has higher contrast with respect to the substrate 314 than the ink utilized to form the patterned layers 316, 320 in the first zone 350, and when observed by the naked eye appears to be darker than the layers 316, 320, or even dark black.

Inconsistent edge detection of the fiducial mark 402 translates directly to inaccurate position information that is used for dynamic alignment of any additional printed layers applied overlying or adjacent to the layers 316, 320. The quality of a fiducial mark can be related to the ability to reliably detect the fiducial mark during the printing registration process. The detection of the fiducial marks on a web needs to be consistent from mark to mark on the web in order to use on-line detection as a reference for associated patterns. A poor quality fiducial mark 402, although in registration with the patterned layers 316, 320, will produce enough ambiguity in the position of the patterned layers 316, 320 that registration is severely inhibited to the point of low yield due to misalignment subsequently applied patterned layers.

One characteristic of fiducial mark quality that has been observed is the print density of the mark. Detection of the fiducial mark is dependent on the absorption and subsequent blocking of transmission of any light through the substrate. An ideal fiducial mark would provide 100% absorption of incident light from a detector and, along with a high speed sensor with low variability in response time, produce a square wave in a plot of web position vs. light transmission as a web is passed in front of a sensor. The sensor would be adjusted to trigger (generate a change in output signal voltage from a low output to a high output) at the midpoint between sensing the fiducial mark and not sensing the fiducial mark. As a non-limiting example, a suitable fiducial mark should provide absorption of about 100% to about 50% of incident light from a detector, or about 100% to about 75%, or about 100% to about 90% (e.g. optical transmission of about 0% to about 50%, or about 0% to about 25%, or about 0% to about 10%.)

Suitable sensors should have a sufficiently rapid response time to provide reliable on-line web detection of the fiducial mark 402. One non-limiting example of a suitable sensor is available from Optex-Ramco, West Des Moines, Iowa, which has a response time of about 16 μs.

In various embodiments, the fiducial marks 402 in the second zone 400 and at least a portion of the predetermined pattern of resist material 320 in the first zone 350 are in registration. The absolute registration error between the fiducial marks 402 and the patterned resist material 320 is made up of only those normal contributions to pattern accuracy related to flexographic or gravure printing. The contributions to normal pattern inaccuracy include non-elastic distortion of the substrate after printing as well as elastic distortion during the printing process that will result in the pattern distortion once the substrate is allowed to return to its undistorted condition. A typical example of nonelastic distortion after printing is thermal shrinkage of PET film. An example of elastic distortion during printing is compressive (typically cross web) or extensive (typically down web) web strain due to normal web tension required for transport through the printing process. Other contributions to pattern error are the normal plate manufacturing error as well as distortion of the plate during the mounting process. The process of flexographic printing is known to increase or decrease local features on a pattern due to the surface energy of the substrate, the plate and the surface tension of the ink. All of these known patterning errors are greater than the error in registration between the fiducial mark 402 in the second zone 400 and the patterned resist material 320 in the first zone 350. In essence, the alignment error related to this fiducial patterning process is absolutely minimized and not likely to be separated from normal printing induced errors. In some embodiments, for example, the error in registration between the fiducial mark 402 and the patterned resist material 320 is less than about 100, less than about 20, or less than about 10 microns.

Figure 6:
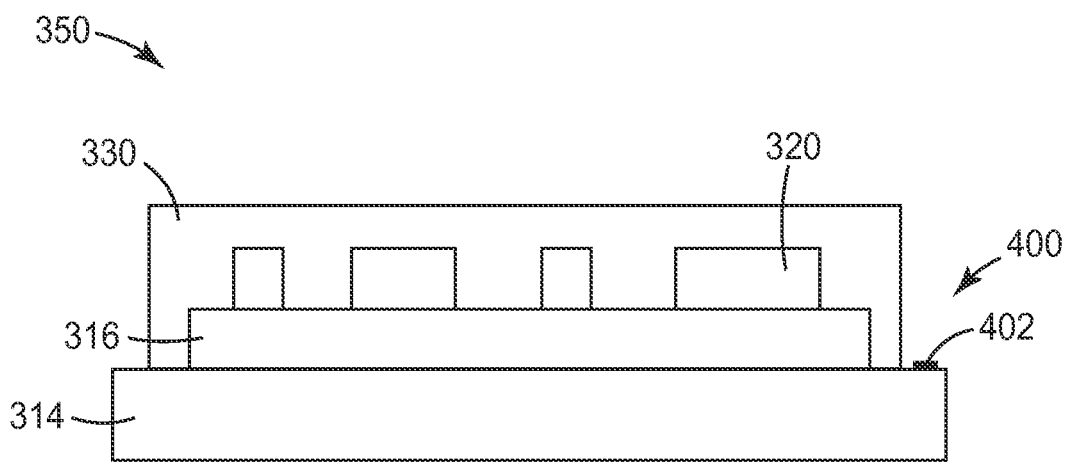
FIG. 6 is a schematic, cross-sectional view of the construction of FIG. 5 overlain by a strippable polymer layer.

Referring to FIG. 6, in the first zone 350 on the substrate a strippable polymer material 330 is applied over the conductive nanowire layer 316 and the resist layer 320 on the substrate 314 (e.g., coated; or patterned, for example by printing, onto a one or more portions of the conductive nanowire layer 316 on the substrate 314). Upon being so applied, the strippable polymer material 330 renders the conductive nanowire layer 316 removable by peeling (e.g., in the one or more regions where the strippable polymer material 330 is patterned). In general, the strippable polymer material 30 applied to the conductive nanowire layer 316 is less adherent to the substrate than a resist matrix material applied to the same conductive nanowire layer coated on the substrate. In general, a strippable polymer material 330 applied to the resist matrix material 320 that is applied to the conductive nanowire layer 316 is less adherent to the resist matrix material 320 than the resist matrix material is adherent to the conductive nanowire layer 316.

Suitable strippable polymer materials readily coat and adhere to the conductive nanowire layer 316 while not unduly adhering to either the substrate 314 or the resist matrix material 320 such that the layer 330 can be peeled from both the resist matrix material 320 and the substrate 314. The selection of chemical composition for the strippable polymer layer 330 depends on the selection of the substrate 314, the resist matrix material 320, and the specific composition of the conductive nanowire layer 316.

One suitable strippable polymer layer comprises polyvinyl alcohol (PVA). It has been found in some embodiments that a molecular weight of approximately 8,000 to 9,000 Daltons (Da) for the PVA is preferred. A suitable commercially available coating composition comprising PVA is MacDermid's Print & Peel available from MacDermid Autotype, Inc., Rolling Meadows, Ill. Print and Peel is a water based screen printable varnish designed to be selectively printed onto a range of surface finishes to act as an easily removable protective mask. Surprisingly, it was found that the adhesion of this composition to the nanowire layer 316 was sufficient to completely remove it from the substrate 314 in unwanted areas while readily leaving the nanowire areas covered by the resist pattern 320 attached to the substrate during the subsequent peeling operation.

Another commercially available strippable polymer material is Nazdar 303440WB Waterbase Peelable Mask available from Nazdar Ink Technologies, Shawnee, Kans. Another suitable strippable polymer layer can be formulated by mixing poly vinyl alcohol (PVA) and Triton X-114 available from Union Carbide (or another suitable surfactant) and deionized water. One suitable formulation can comprise 20% by weight PVA (8,000 to 9,000 Da molecular weight), 2% by weight Triton X-114, and the balance deionized water.

Preferably, the strippable polymer layer 330 is delivered to the resist matrix material 320 patterned substrate 314 in a liquid state. The strippable polymer layer 330 is formed by applying a strippable polymer layer-forming liquid to the resist matrix material patterned substrate. A dryer can be optionally used to harden or cure the strippable polymer layer 330 after application by a coater. The strippable polymer layer-forming liquid is applied to the substrate using known application methods, such as slot coating, gravure coating, roll coating, flood coating, notch bar coating, spraying, thermal compression lamination, screen printing, or vacuum lamination.

As shown in FIG. 5, the surface of the substrate 315 in the first zone 350 having a conductive nanowire layer 316 and a resist matrix material pattern 320 includes: i) one or more first regions 317 of exposed conductive nanowire layer 316 and ii) one or more second regions 322 of conductive nanowire layer overlain by resist matrix material. Generally, the resist matrix material regions are raised with respect to the exposed conductive nanowire layer regions. Generally, at the border between a resist matrix material region and an exposed conductive nanowire layer region, a change in relief exists. An example of such a change in relief is a step edge between the exposed conductive layer region and the resist matrix material region of the resist matrix material. The step edge may have a height (as approximated by the thickness of the resist matrix material in the aforementioned example) and it may have a lateral extent (e.g., distance, approximately in a plane parallel to the substrate, over which the step edge exists). Depending upon the change in relief, and depending upon the in-plane geometries of the resist matrix material and exposed conductive layer regions (e.g., shapes and sizes), making contact to substantially the entire exposed conductive material surface with the strippable polymer layer may be challenging. If a portion of the exposed conductive nanowire layer region is not contacted by the strippable polymer layer, that portion may not be removed successfully or with high pattern fidelity, during the subsequent peeling step.

Accordingly, in some embodiments, the strippable polymer-forming liquid layer is applied to the resist matrix material patterned substrate, wherein at least 50%, preferably at least 75%, more preferably at least 90%, more preferably at least 95%, more preferably at least 99%, and most preferably 100% of the exposed conductive layer is contacted by the strippable polymer layer material.

Regarding the strippable polymer layer-forming liquid that is delivered to the resist matrix material patterned substrate, it may be a polymer solution, a polymer dispersion, a monomer solution, a monomer, a mixture of monomers, or a melt. The liquid may include minor amounts of secondary components (e.g., photoinitiators, surface active agents, viscosity modifiers). The strippable polymer layer is not delivered as a solid (e.g., a viscoelastic solid, such as a cross-linked pressure sensitive adhesive exhibiting appreciable yield stress that would limit the degree of contact between the adhesive and the exposed conductive or nanowire material in the exposed nanowire material regions). Application of the strippable layer in a liquid state leads to high resolution (high fidelity) patterning of the conductive or nanowire layer after peeling the strippable polymer layer from the resist matrix material patterned substrate.

The viscosity of the strippable polymer layer-forming liquid can be selected with consideration of the application method that will be used to deliver it to the resist matrix material patterned substrate. For example, for slot coating, roll coating, gravure coating, flood coating, notch bar coating, screen printing, or spraying of a polymer solution, monomer, or monomer solution: the viscosity can be between 1 cps and 10,000 cps (0.001 and 10 Pa-s), preferably between 10 cps and 2,500 cps (0.01 and 2.5 Pa-s). For thermal compression or vacuum lamination of a polymer melt, the viscosity may be between 10,000 cps and 100,000,000 cps (10 Pa-s and 100 Pa-s). The strippable polymer layer-forming liquid preferably has zero yield stress. Some useful strippable polymer layer-forming liquids may develop a very low yield stress, preferably less than 100 Pa, more preferably less than 50 Pa, even more preferably less than 5 Pa, even more preferably less than 1 Pa.

The strippable polymer layer 330 is substantially continuous over at least a portion of the first major surface 315 of the substrate 314 in the first zone 350 and desirably over at least 50%, 60%, 70%, 80%, or 90% of the first major surface's area. The strippable polymer layer may be applied in discrete blocks or rectangles leaving uncoated substrate areas between them with the blocks or rectangles having a size similar to the overall size of the intended touch screen being produced. By "substantially continuous" it is meant the strippable polymer layer is applied over multiple patterned resist matrix material lines, traces, or discrete features such that the strippable polymer layer covers not only the patterned resist matrix material 320 but also the conductive nanowire layer 316 present between the patterned resist matrix material. Typically, a uniform thickness and continuous coating of strippable polymer material is applied over at least some portion of the substrate, but not necessarily the entire width or length of the substrate. For example, the middle portion of the substrate could be coated with the strippable polymer material while a strip or margin along each edge is left uncoated.

The approach described here has several advantages. First, by casting the strippable polymer layer from as a liquid, it is possible to create very intimate contact between the strippable polymer layer and the conductive nanowire layer. Second, this intimate contact prevents removed portions of the conductive nanowire layer from falling onto the substrate after the strippable polymer layer is removed, avoiding contamination of the substrate that could substantially decrease product yields. Finally, after the over coating step, the strippable polymer layer can remain in place during transportation, handling, and converting operations, serving as a protective film and eliminating the need for an additional liner to be applied after the fact, which could be the case if the conductive nanowire material were patterned using laser ablation.

The strippable polymer layer is applied with a sufficient thickness to cover both the patterned resist matrix material 320 and the conductive nanowire layer 316. Typical thicknesses for the strippable polymer layer are from about 2 μm to about 10 μm, or from 10 μm to 25 μm, or from 25 μm to 100 μm. After applying the strippable polymer layer, the layer is hardened or cured as needed. An optional dryer can be used to speed up the hardening or curing process. A thinner layer of strippable polymer material is preferred, since it requires less energy to remove the solvent from the coating composition, leading to faster drying, and therefore, processing times. In some embodiments, an optional premask (not shown in FIG. 6) may be laminated to a surface of the strippable polymer layer 330 to provide mechanical support during the peeling step.

Figure 7:
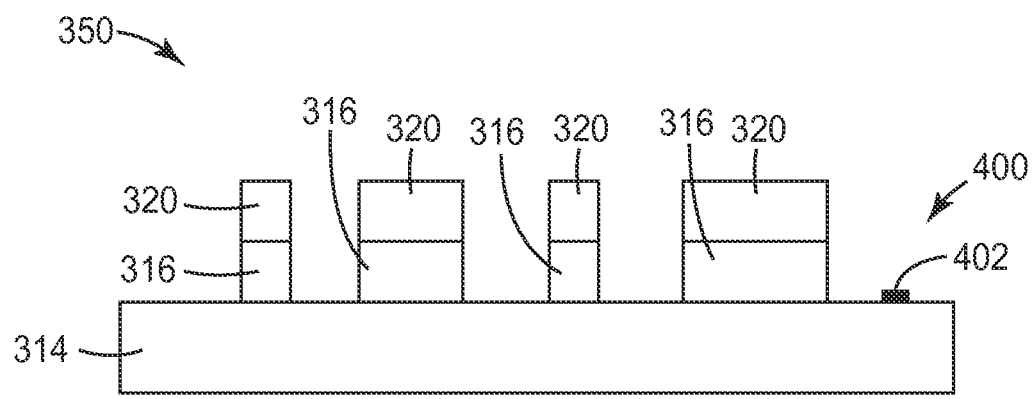
FIG. 7 is a schematic, cross-sectional view of the construction of FIG. 6 following removal of the strippable polymer layer.

Referring now to FIG. 7, the strippable polymer layer 330 is peeled away. The strippable polymer layer 330 may be removed by a wide variety of techniques such as, for example, by passing the substrate 314 with all of the applied layers though a delaminating nip (not shown in FIG. 7). The strippable polymer layer 330 with attached conductive nanowire material 316 in areas of the substrate unprotected by the patterned (e.g., printed) resist matrix material 320 is removed from the substrate 314. Peeling the strippable polymer layer 330 from the substrate 314 removes the conductive nanowire material 316 in selected regions of the substrate thereby forming a patterned nanowire layer in which each region of the nanowire layer remaining on the substrate 314 is overlain by resist matrix material 320.

Figure 8:
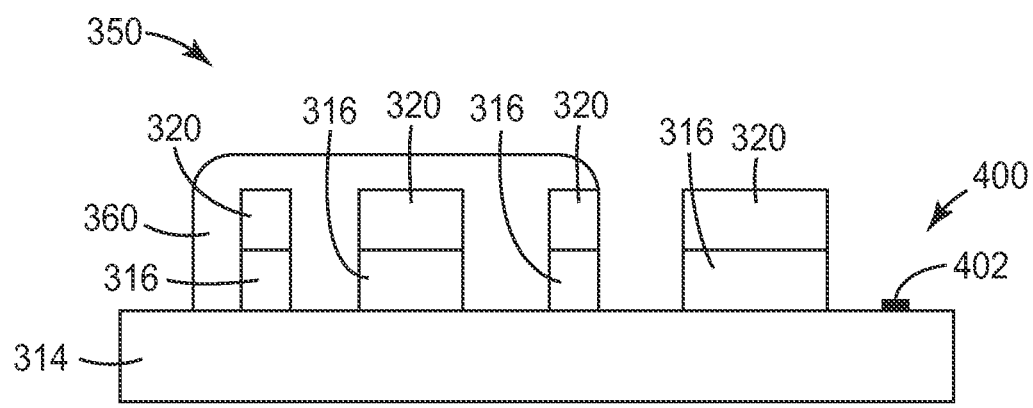
FIG. 8 is a schematic, cross-sectional view of the construction of FIG. 7 partially overlain by a secondary conductive pattern.

Referring now to FIG. 8, once the patterned nanowire layer 316 is formed in the first zone 350 of the substrate 314, in a subsequent printing or application step a secondary pattern of a material 360 is formed over the patterned nanowire layer 316. Using the fiducial mark 402 as a guide, the secondary pattern 360 is aligned with the silver nanowire layer 320. The secondary pattern of material may be applied in any suitable manner, including, for example, but not limited to, flexographic printing, screen printing, gravure printing, ink-jet printing, offset lithographic printing and patterned spray coating. In other embodiments, the secondary pattern of material 360 could be formed by a lift-off process, where a metallized layer can be deposited by vacuum deposition. For example, the metallized layer from Example 2 below could be formed in registration to the patterned nanowire layer 316 by printing a water-soluble layer, e.g. like the one printed in Example 1 below, vacuum deposition of a metal, and then finally washing of the lift-off layer, leaving a vacuum-deposited interconnect layer 360 registered to the patterned nanowire layer 316.

The secondary pattern of material 360 may be formed from a wide variety of materials, referred to generally herein as "inks," which may be selected to provide one or more useful properties. For example, the ink from which the secondary pattern 360 is derived may be selected for its electric (conductive or insulating) properties, optical properties (for example, index of refraction, haze or transmission properties) or even acoustic properties.

In some embodiments, the secondary pattern of material 360 may be conductive. For example, the secondary pattern may be a silver nanoparticle ink that can in some embodiments form conductive traces overlying selected portions of the patterned nanowire layer. Edge sensing of the fiducial mark 402 ensures that the silver nanoparticle ink 360 is accurately applied in registration with the resist matrix material 320, which in turn ensures accurate placement of the conductive traces 360 with respect to the silver nanowire layer 316. The conductive traces 360 may in turn be connected to flex circuits, conductive adhesives or any other type of conductor to form an electronic device. The electronic device could then be incorporated into an electronic component such as, for example, a display device such as a liquid crystal display.

While any pattern of fiducial marks that allows the determination of the position of the predetermined pattern is workable, some possibilities offer distinct advantages. In particular, fiducial marks useful for determining the down web and/or cross web position of a moving web, and methods related to those patterns, can be found in copending and coassigned US application nos. 2010/0196607, "Systems and methods for fabricating displacement scales," 2010/0188668, "Total internal reflection displacement scale;" and 2011/0247511, "Apparatus and Method for Making Fiducials on a Substrate." In particular, the fiducial marks illustrated as 208 in FIG. 4 are disclosed in US 2011/0257779, "Phase-locked Web Position Signal Using Web Fiducials."

Embodiments of the present disclosure will now be described in more detail in the following examples, which are not intended to be limiting.

EXAMPLE 1

A printing apparatus generally as illustrated in FIGS. 1 and 2 was constructed. The printing roll was 12 cm in diameter. The roll had a predetermined pattern of connected diamonds in both the first and the second zones. On a stainless steel doctor blade, three barriers were formed against the roll from vinyl polysiloxane impression material commercially available as 3M ESPE 7302 EXPRESS from 3M Company of St. Paul, Minn.

A water soluble ink as disclosed in U.S. Pat. No. 4,895,631 was dispensed onto the doctor blade in the first zone, while a UV curable, non-water-soluble ink, commercially available as 9301 Opaque white UV flexo ink from Nazdar Ink Technologies of Shawnee, Kans., was dispensed onto the doctor blade in the second zone. After a pause to allow the roll to become inked, printing was begun onto a substrate of conventional polyester terephthalate (PET) film, conveyed at a line speed of 2 m/min and at a tension of 1 pound/linear inch (1.75 N/cm). The web was passed through a UV curing station having a microwave light source commercially available as a Model I250B from Fusion UV Systems, Inc. of Gaithersburg, Md., connected to a power supply commercially available as Model VPS-48, also from Fusion UV Systems, Inc. This station was set to 40% power and was supplied with 8 SCFM of nitrogen. This caused the second ink to become non-soluble.

EXAMPLE 2

The film according to Example 1 was passed through a sputter deposition apparatus of conventional type, e.g. a roll-to-roll vacuum chamber similar to the system described in U.S. Pat. Nos. 5,440,446 (Shaw et al.) and 7,018,713 (Padiyath, et al.). A 40 nm thick layer of indium tin oxide (ITO) was deposited on the substrate in the first zone. The film is then rinsed in water, causing the water soluble ink to be dissolved away in the first zone, carrying with it the portion of the sputtered layer above the predetermined pattern. The fiducial marks in the second zone printed with the UV curable ink remained on the film after rinsing with water. Predetermined patterns formed in this way can have features with a dimension less than 20 mils (0.5 mm).

EXAMPLE 3

An apparatus generally as depicted in FIG. 3 was constructed. A first ink, commercially available as 9301 Opaque white UV flexo ink from Nazdar Ink Technologies was dispensed from the first inker onto a microflexo printing roll in the first zone. The microflexo printing roll had a predetermined pattern of spaced apart rectangles in the first zone. A second ink, commercially available as 9319 Base Process Blue UV flexo ink from Nazdar Ink Technologies, was dispensed from the second inker onto the microflexo printing roll in the second zone. The microflexo printing roll had a predetermined pattern of spaced apart rectangles in the second zone. These inks were printed from the anilox roll onto a substrate of white paper coated with a silicone release liner and then over coated with a thin layer of a pressure sensitive adhesive, specifically a random copolymer of 90% by weight of iso-octyl acrylate and 10% by weight of acrylic acid. After the printing, the web was passed through a UV curing station having a microwave light source commercially available as a Model I250B from Fusion UV Systems, Inc., connected to a power supply commercially available as Model VPS-48, also from Fusion UV Systems, Inc. This station was set to 40% power and was supplied with 8 SCFM of nitrogen. This particular film and ink composition is simulative of certain security mark applications; and, after the inks were dried, the pattern within the first zone was nearly invisible to the naked eye in normal room illumination. However the ink in the second zone was sharp and plainly visible.

This low-contrast between the inked area and the substrate within zone 1 was assessed by measuring the reflectance of adjacent inked and uninked areas using a MICROMAX photometric camera commercially available from Princeton Instruments of Trenton, N.J. Data was collected at maximum angular apertures of 8.6, 17.5, and 30.0 degrees and under conditions where the cone of illumination was equal to the cone of collection. The results are presented in Table 1 and each entry represents the mean of five experiments in different random portions of the inked substrate. $R_s$ is the reflectance of the substrate in arbitrary units. $R_i$ is the reflectance of the inked area in arbitrary units. Three values were calculated from these values: $C_c$ is $R_s/R_i$, $C_a=(R_s-R_i)/R_i$, and $C_b=(R_s-R_i)/((R_s+R_i)/2)$.

TABLE 1

| Magnification of the camera objective | Minimum aperture | Maximum aperture | $R_s$ | $R_i$ | $C_c$ | $C_a$ | $C_b$ |
|---|---|---|---|---|---|---|---|
| 5X | 0.15° | 8.6° | 28689 | 24877 | 1.1532 | 0.1532 | 0.1423 |
| 10X | 0.30° | 17.5° | 30244 | 29130 | 1.0382 | 0.0382 | 0.0375 |
| 20X | 0.50° | 30.0° | 25746 | 26735 | 0.9630 | −0.0370 | −0.0377 |

One definition of "low-contrast ink" may be stated as one where the $C_c$ value calculated when the $R_s$ and $R_i$ values are measured at a 30.0° aperture with the cone of illumination equal to the cone of collection is between about 0.9 and 1.1.

EXAMPLE 4

The printed web of Example 3 was conveyed against a conventional printing roll having a secondary pattern intended to be complimentary for a particular end use to the predetermined pattern. Although the virtually invisible, the position of the first predetermined pattern is known through the visible fiducial marks. A secondary pattern is then applied to the web through, e.g. printing or laminating. The web is the conveniently steered into an appropriate registration between the first predetermined pattern and the secondary pattern using, e.g. the techniques of US 2012/068376, "Apparatus for Guiding a Moving Web."

EXAMPLE 5

A mixture composed of 95% by weight ClearOhm™ Ink-N G4-02 (available from Cambrios Technologies Corporation, Sunnyvale, Calif.) and 5% by weight isopropyl alcohol (available from Sigma Aldrich, St. Louis, Mo.) was mixed by agitation in a 5 gallon pail to yield a coating formulation referred to below as a nanowire formulation. The nanowire formulation was coated 13 inches wide onto a first zone of 17 inch wide and 5 mil thick polyethylene terephthalate (PET) substrate (Melinex ST-504 film, available from Dupont, Wilmington, Del.) using a slot die, targeting a pre-metered wet film thickness of approximately 20 um at a web speed of 40 ft/min to form a nanowire layer on the substrate. The nanowire layer was then heated to a temperature of 105° C. in air impingement oven for approximately 2 minutes, which resulted in a coated and dried transparent and electrically conductive nanowire layer.

The optical transmission and haze of the nanowire layer and substrate were measured with a Haze Gard Plus (BYK Gardner USA, Columbia, Md.) and determined to be 91.5% and 1.7%, respectively. The sheet resistance was measured to be between 40 and 50 Ohms/Sq., as determined by a two-point probe measurement.

Two UV-curable printing inks (a clear low-contrast ink and a black high-contrast ink) were deposited in conjunction onto two separate regions of the nanowire-coated substrate, using a single patterned photopolymer flexographic printing stamp. The first ink (Flint Group UFR0-0061-465U, Flint Group Print Media North America, Batavia, Ill.) —printed on the central first region of the nanowire-coated substrate— was clear and mostly transparent to the naked eye. The second ink (Nazdar 9300 Series UV Flexo Ink, 9334 FR Process Black (BW8), Nazdar, Shawnee, Kans.)—printed on the outer edges of the nanowire-coated substrate with two separate inking applicators—was black, mostly opaque to the naked eye, and formed the printed fiducial markings for subsequent registered printing. The flexographic tool used to print both the electrode and fiducial patterns was fabricated by Southern Graphics Systems (SGS, Minneapolis, Minn.) based on an image that defined the pattern. The two UV-curable inks were printed at a speed of 30 ft/min, using a 2.0 BCM/sq. in. anilox roll (rated to give a wet coating of approximately 0.5 to 2.0 microns), and the resultant patterned UV-curable layers were irradiated with high intensity UV light in a nitrogen-purged atmosphere with a mercury arc lamp UV curing assembly from Xeric Web (Xeric Web Drying Systems, Neenah, Wis.). UV intensity measured during the curing conditions at a run speed of 20 fpm was 0.552 W/cm$^2$ in the UVA wavelengths and 0.519 W/cm$^2$ in the UVB wavelengths. (UVA wavelengths are meant to reference 315-400 nm and UVB wavelengths are meant to reference 280 to 315 nm).

An Optex #D3RF-TP photoelectric sensor with a Sunx #FD-42GW diffuse coaxial bifurcated fiber optic and a Sunx #FX-MR2 fiber optic zoom lens were mounted approximately 1" (25 mm) from the substrate to the lens with the polished anilox roll as the support and background reflector on the transparent PET substrate. The lens was aligned with the reflective support roll and the clear substrate on the roll to obtain a maximum reflected signal as shown on the D3RF numerical display. Once the alignment of the lens and fiber bundle was made for maximum signal, the lens distance to the web was adjusted to provide a reflected signal of 100 counts on the D3RF numerical display.

With the sensor showing the 100 counts of reflecting signal associated with the substrate with "no fiducial mark," the web was indexed forward until a fiducial completely covered the visible "red" sensor light on the substrate. The numerical readout dropped from the previous 100 counts to a lower value, and this value displayed on the D3RF depended on the "darkness" or "contrast" of the fiducial relative to the substrate without the fiducial.

Figure 9:
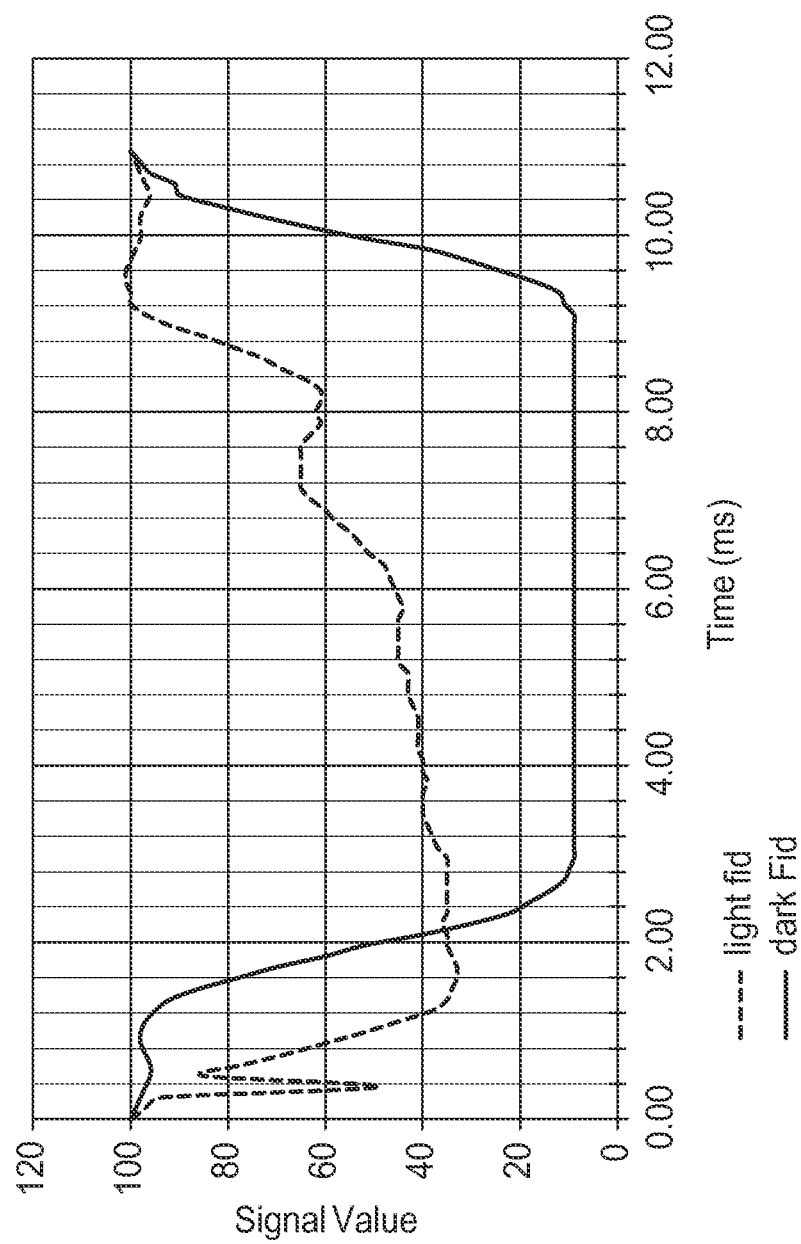
FIG. 9 is a plot of signal value vs. time used to assess edge detectability for two fiducial marks.

A plot of the time vs. signal value is shown in FIG. 9 for a high contrast (dark) fiducial mark and a low contrast (light) fiducial mark. The time value is related to a line speed of 50 fpm and can be directly associated with web position. Of particular note is the fact that the same trigger value cannot be used for both marks as the preferred trigger level for the high contrast mark, when used on the low contrast fiducial mark is at a level very close to the "floor" or detected value for the low contrast mark. Any variation in sensing fiducials from mark to mark results in significant ambiguity of the position of the edge of the fiducial (indicated by a signal level of approximately 55 counts on the D3RF display).

Simultaneously with the application of the low contrast UV-curable printing ink to form a pattern on the nanowire layer, a second high contrast UV-curable printing ink was applied in a second zone of the substrate different from the first zone to form a fiducial mark. The pattern of the low-contrast UV-curable printing ink and the fiducial marks were in registration. To improve edge detection and enhance the accurate placement of subsequently applied layers, the second UV-curable ink forming the fiducial mark in the second zone was selected to provide, when dried, a distinct contrast to the transparent nanowire ink and the UV curable ink in the first zone. The second UV-curable ink utilized in this example was Nazdar 9300 Series UV Flexo Ink, 9344 FR Process Black (BW8), which was commercially available from Nazdar, Shawnee, Kans.

A mixture composed of 99% by weight MacDermid Print and Peel (MacDermid Inc., Denver, Colo.) and 0.25% by weight Tergitol S-15-7 surfactant (available from Sigma-Aldrich, St. Louis, Mo.) was prepared for use as the strippable polymer layer. The strippable polymer composition was over-coated onto the printed film from the previous steps, using an offset gravure coating method utilizing a 36 BCM/sq. in. gravure roll and a rubber transfer roll. The coated film was then passed through an air impingement and IR oven until the strippable polymer solution was dry to the touch, and then an adhesive liner was laminated to its surface. During input to the remaining registered printing steps, the laminator liner was removed, peeling the strippable polymer and leaving behind a patterned nanowire substrate (overlain with low-contrast clear UV-cured ink) with black UV-cured fiducials markings on the film edges. The desired effect of the transparent nanowire ink with the clear UV ink is to provide a patterned transparent conductor on the PET film. The patterned Cambrios with resist provides very little contrast or visible differentiation in reflection or transmission mode. The second UV-curable ink forming the fiducial mark was sufficiently dark to provide a distinct contrast to the transparent nanowire ink and the clear UV ink.

Using the fiducial mark in the second zone as an alignment feature or guide, a patterned layer of a silver nanoparticle flexographic printing ink available from PChem Associates, Inc., Bensalem, Pa., was applied over selected portions of the first zone—over the clear UV-curable ink on the nanowire ink, as well as on selected portions of the substrate. The silver nanoparticle ink formed conductive traces electrically connected to selected regions of the second nanowire ink. The silver nanoparticle flexographic ink was printed using a patterned photopolymer stamp fabricated by Southern Graphics Systems (SGS, Minneapolis, Minn.). The printed pattern consisted of 150 um wide traces at a 300 um pitch which was printed at 50 fpm with a 300 BCM, 900 LPI anilox roll. The material was dried at full intensity with a single IR unit and two air impingement dryers. The IR drying equipment was from Xeric Web Systems (Xeric Web Systems, Neenah, Wis.). The IR bulbs are medium wavelength IR with power output at 50 fpm during silver print at 108 joules/in2. The impingement dryers were two dryers in series, each with six drying bars. Both dryers were set at an air temperature of 275 degrees Fahrenheit and manifold supply pressure of 15 psi. Equipment was from Flex Air Inc (Flex Air Inc, Green Bay, Wis.).

Figure 10:
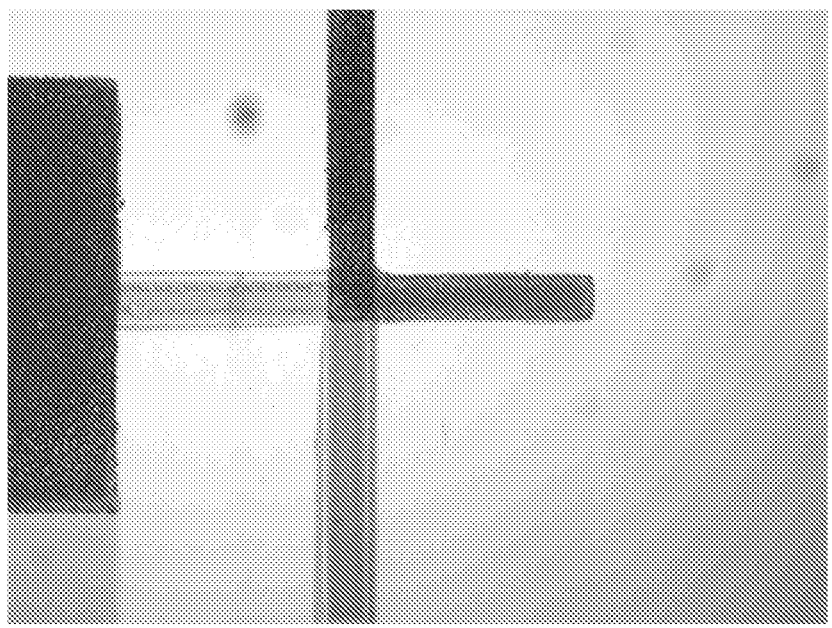
FIG. 10 is a photograph of a fiducial mark aligned with the silver nano-particle ink pattern in Example 5.
Figure 11:
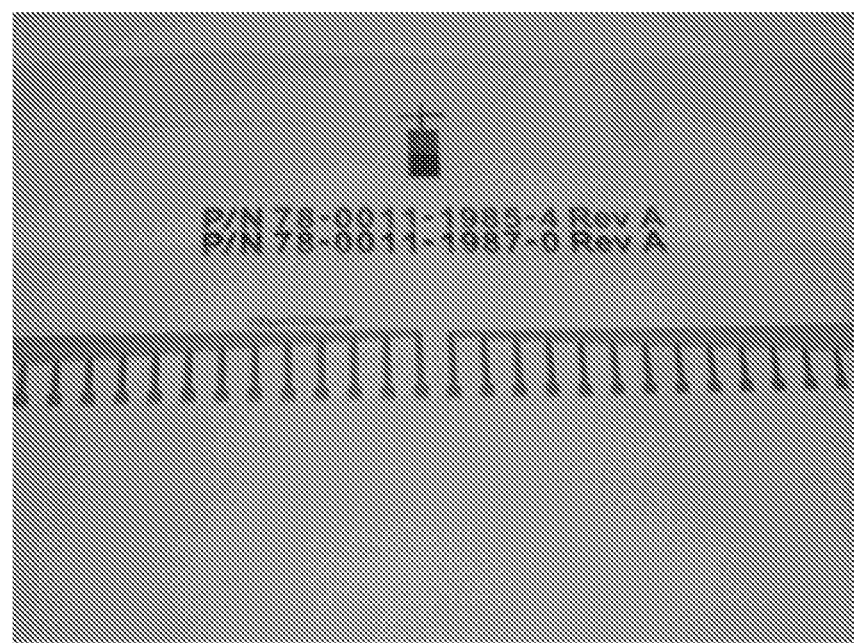
FIG. 11 is a photograph of an electronic assembly made according to Example 5.

The fiducial pattern of the second dark UV ink when aligned with the silver nano-particle ink pattern is shown in FIG. 10. The silver nanoparticle ink appears much darker due to the image being in transmission and the silver nanoparticle ink's much more opaque characteristics. In reflected light as viewed by the sensor the silver nanoparticle ink is lighter in color and reflective while the fiducial mark (shown much lighter in transmission) is a very dark black. An image of a portion of the final article with blue protective lamination is shown in FIG. 11. The photo in FIG. 11 shows the circuit interconnects printed in silver nano-particle ink and the dark black fiducial mark (located at the top of the photo) used as the reference to align the (non-visible in FIG. 10) patterned transparent nanoparticle ink pattern to the later printed circuit interconnects ink.

Other modifications and variations to the present disclosure may be practiced by those of ordinary skill in the art, without departing from the spirit and scope of the present disclosure, which is more particularly set forth in the appended claims. It is understood that aspects of the various embodiments may be interchanged in whole or part or combined with other aspects of the various embodiments.

All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. A method, comprising:
    forming a resist layer overlying a patterned conductive nanowire layer in a first zone on a substrate to form a low contrast first conductive pattern;
    forming, substantially simultaneously with the first conductive pattern, a high contrast fiducial mark in a second zone of the substrate different from the first zone, wherein the fiducial mark is in registration with the first conductive pattern;
    forming, using the fiducial mark as a guide, a second pattern aligned with the first conductive pattern.

2. The method of claim 1, wherein the first conductive pattern has an optical transmission of greater than about 80% optionally wherein the fiducial mark has an optical transmission of about 0% to about 50%.

3. The method of claim 1, wherein the error in registration between the fiducial mark and the first conductive pattern is less than about 20 microns.

4. The method of claim 1, wherein the first conductive pattern includes features having a dimension less than 200 microns in size.

5. The method of claim 1, wherein the second pattern is conductive.

6. The method of claim 5, wherein the second pattern is aligned with the first conductive pattern and forms an electronic assembly.

7. The method of claim 5, wherein the patterned conductive nanowire layer in the first zone on the substrate is produced by:
    coating a substrate with a conductive layer comprising nanowires;
    applying a pattern on the conductive layer with a resist matrix material to generate on the substrate one or more first regions of exposed conductive layer and one or more second regions of resist matrix material;
    hardening or curing the resist matrix material;
    over coating the pattern with a strippable polymer layer;
    hardening or curing the strippable polymer layer;
    peeling the strippable polymer layer from the substrate; and
    removing the exposed conductive layer from the substrate in the one or more first regions of the substrate to form a patterned conductive layer on the substrate, wherein the patterned conductive layer comprises nanowires overlain by the resist matrix material.

8. The method of claim 7, wherein the pattern on the conductive layer is applied by a process selected from at least one of photolithography, flexographic printing, gravure printing, ink jet printing, screen printing, spray coating, needle coating, photolithographic patterning, and offset printing.

9. An electronic assembly, comprising:
   a substrate comprising in a first zone a low contrast first conductive pattern;
   a high contrast fiducial mark in a second zone of the substrate different from the first zone; wherein the fiducial mark and the first conductive pattern are in registration; and
   a second conductive pattern aligned with the first conductive pattern.

10. The electronic assembly of claim 9, wherein the fiducial mark and the first conductive pattern are in registration with a dimensional accuracy of less than about 100 microns.

11. The electronic assembly of claim 9, wherein the fiducial mark and the first conductive pattern are in registration with a dimensional accuracy of less than about 20 microns.

12. The electronic assembly of claim 9, wherein the difference in optical transmission in the visible light region on the substrate between the fiducial mark and the second conductive pattern is greater than about 50%.

13. The electronic assembly of claim 9, wherein the first conductive pattern has an optical transmission in the visible light region of about 80% to about 99.9%.

14. The electronic assembly of claim 9, wherein the fiducial mark has an optical transmission in the visible region of less than about 50%.

15. The electronic assembly of claim 9, wherein the second conductive pattern is a circuit interconnect.

16. The electronic assembly of clam 9, wherein the circuit interconnect is in-plane with respect to the first conductive pattern.

17. An electronic assembly, comprising:
   a substrate comprising in a first zone a first conductive pattern, wherein the first conductive pattern comprises conductive nanowires overlain by a layer of a resist matrix material, and wherein the conductive pattern has an optical transmission in the visible region of greater than about 80%;
   a fiducial mark in a second zone of the substrate different from the first zone, wherein the fiducial mark has an optical transmission in the visible region of less than about 50%, and wherein the fiducial mark and the second conductive pattern are in registration with a dimensional accuracy of less than about 100 microns; and
   a second conductive pattern aligned with the first conductive pattern.

18. The electronic assembly of claim 17, wherein the resist matrix material has a thickness of about 10 nanometers to about 3000 nanometers.

19. The electronic assembly of claim 17, wherein the resist matrix material has a light transmission of at least 80%.

20. The electronic assembly of claim 17, wherein the second conductive pattern is a circuit interconnect.

* * * * *

UNITED STATES PATENT AND TRADEMARK OFFICE
CERTIFICATE OF CORRECTION

PATENT NO.        : 9,807,871 B2                                    Page 1 of 1
APPLICATION NO.   : 14/912176
DATED             : October 31, 2017
INVENTOR(S)       : Daniel Theis et al.

It is certified that error appears in the above-identified patent and that said Letters Patent is hereby corrected as shown below:

In the Specification

<u>Column 7</u>
Line 10, Delete "gylcol" and insert -- glycol --, therefor.

<u>Column 11</u>
Line 59, After "cross-linking" insert -- . --.

<u>Column 21</u>
Line 22, Delete "low-constrast" and insert -- low-contrast --, therefor.

In the Claims

<u>Column 24</u>
Line 3, In Claim 16, delete "clam" and insert -- claim --, therefor.

Signed and Sealed this
Fourteenth Day of August, 2018

Andrei Iancu
*Director of the United States Patent and Trademark Office*